United States Patent
Choi et al.

(10) Patent No.: US 9,997,741 B2
(45) Date of Patent: Jun. 12, 2018

(54) METHOD OF MANUFACTURING ORGANIC LIGHT EMITTING DISPLAY APPARATUS

(71) Applicant: SAMSUNG DISPLAY CO., LTD., Yongin-si, Gyeonggi-do (KR)

(72) Inventors: Jong-Hyun Choi, Yongin-si (KR); Dong-Hyun Lee, Yongin-si (KR); Dae-Woo Lee, Yongin-si (KR); Seong-Hyun Jin, Yongin-si (KR); Guang-Hai Jin, Yongin-si (KR)

(73) Assignee: SAMSUNG DISPLAY CO., LTD., Yongin, Gyunggi-do (KR)

( * ) Notice: Subject to any disclaimer, the term of this patent is extended or adjusted under 35 U.S.C. 154(b) by 0 days. days.

(21) Appl. No.: 15/374,840

(22) Filed: Dec. 9, 2016

(65) Prior Publication Data

US 2017/0125748 A1   May 4, 2017

Related U.S. Application Data

(60) Continuation of application No. 14/526,888, filed on Oct. 29, 2014, which is a division of application No. (Continued)

(30) Foreign Application Priority Data

Dec. 14, 2011   (KR) .......................... 10-2011-0134464

(51) Int. Cl.
    *H01L 51/56*   (2006.01)
    *H01L 27/32*   (2006.01)
    (Continued)

(52) U.S. Cl.
    CPC .......... *H01L 51/56* (2013.01); *H01L 27/3218* (2013.01); *H01L 27/3246* (2013.01);
    (Continued)

(58) Field of Classification Search
    None
    See application file for complete search history.

(56) References Cited

U.S. PATENT DOCUMENTS

7,573,191 B2   8/2009   Kobayashi
7,952,095 B2   5/2011   Oue et al.
(Continued)

FOREIGN PATENT DOCUMENTS

JP   2006-269326 A   10/2006
JP   2007-250306 A   9/2007
(Continued)

OTHER PUBLICATIONS

Taiwanese Office Action dated Jul. 13, 2016.
(Continued)

*Primary Examiner* — Matthew Reames
*Assistant Examiner* — Steven B Gauthier
(74) *Attorney, Agent, or Firm* — Lee & Morse P.C.

(57) ABSTRACT

A method of manufacturing an organic light-emitting display includes a first mask process forming an active layer of a TFT and a refractive layer on a substrate, forming a DBR layer covering the active and refractive layers, a second mask process forming a gate electrode and a first electrode unit on the DBR layer, forming an interlayer insulation layer covering the gate electrode and the first electrode unit, a third mask process forming contact holes in the interlayer insulation layer and the DBR layer exposing portions of the active layer and a hole exposing the first electrode unit, a fourth mask process forming source and drain electrodes on the interlayer insulation layer that contact the active layer via the contact holes, and forming a pixel electrode from the first electrode unit, and a fifth mask process forming a pixel definition layer exposing the pixel electrode.

16 Claims, 5 Drawing Sheets

Related U.S. Application Data

13/591,500, filed on Aug. 22, 2012, now Pat. No. 8,878,198.

(51) Int. Cl.
*H01L 51/52* (2006.01)
*H01L 51/00* (2006.01)

(52) U.S. Cl.
CPC ...... *H01L 27/3248* (2013.01); *H01L 27/3262* (2013.01); *H01L 27/3265* (2013.01); *H01L 51/0023* (2013.01); *H01L 51/5265* (2013.01); *H01L 51/5271* (2013.01); *H01L 51/5275* (2013.01)

(56) References Cited

U.S. PATENT DOCUMENTS

| | | | |
|---|---|---|---|
| 2006/0175965 A1 | 8/2006 | Lim | |
| 2008/0246037 A1* | 10/2008 | Kang | H01L 27/1288 257/72 |
| 2009/0101911 A1* | 4/2009 | Kim | H01L 29/66757 257/66 |
| 2010/0052524 A1 | 3/2010 | Kinoshita et al. | |
| 2010/0126584 A1 | 5/2010 | Seol et al. | |
| 2010/0193790 A1* | 8/2010 | Yeo | H01L 27/3248 257/59 |
| 2011/0215305 A1* | 9/2011 | Kim | H01L 51/52 257/40 |
| 2011/0242476 A1 | 10/2011 | Moriwaki et al. | |

FOREIGN PATENT DOCUMENTS

| | | |
|---|---|---|
| KR | 1999-0076085 A | 10/1999 |
| KR | 10-2006-0047610 A | 5/2006 |
| KR | 10-0766939 B1 | 10/2007 |
| KR | 10-2010-0088269 A | 8/2010 |
| TW | 201133823 A | 10/2011 |

OTHER PUBLICATIONS

Korean Office Action issued by the Intellectual Property Office dated Oct. 25, 2017 in the examination of the Korean Patent Application No. 10-2011-0134464.

* cited by examiner

METHOD OF MANUFACTURING ORGANIC LIGHT EMITTING DISPLAY APPARATUS

CROSS-REFERENCE TO RELATED PATENT APPLICATION

This application is a continuation of pending application Ser. No. 14/526,888 filed Oct. 29, 2014, which is a division of application Ser. No. 13/591,500, filed Aug. 22, 2012, now U.S. Pat. No. 8,878,192 B2 issued Nov. 4, 2014, the entire contents of which is hereby incorporated by reference.

This application claims the benefit of Korean Patent Application No. 10-2011-0134464, filed on Dec. 14, 2011, in the Korean Intellectual Property Office, the disclosure of which is incorporated herein in its entirety by reference.

BACKGROUND

1. Field

An aspect of example embodiments relates to an organic light emitting display apparatus and a method of manufacturing the organic light emitting display apparatus.

2. Description of the Related Art

Display apparatuses are recently being replaced by thin flat panel display apparatuses that are portable. Organic light-emitting display apparatuses from among flat panel display apparatuses are self-emission display apparatuses and have a larger viewing angle, better contrast characteristics, and a faster response rate than other display apparatuses, and thus have drawn attention as next-generation display apparatuses.

Organic light emitting display apparatuses have an intermediate layer, a first electrode, and a second electrode. The intermediate layer includes an organic emission layer, and the organic emission layer generates visible light when the first electrode and the second electrode are supplied with a voltage.

SUMMARY

Example embodiments provide an organic light emitting display apparatus and a method of manufacturing the organic light emitting display apparatus, by which emission properties of blue light may be improved.

According to an aspect of the example embodiment, there is provided an organic light-emitting display apparatus, including a substrate including a plurality of red, green, and blue sub-pixel regions, a pixel electrode in each of the plurality of the red, green, and blue sub-pixel regions on the substrate, a Distributed Bragg Reflector (DBR) layer between the substrate and the pixel electrodes, a high-refractive index layer between the substrate and the DBR layer in the blue sub-pixel region, the high-refractive index layer having a smaller area than an area of a corresponding pixel electrode in the blue sub-pixel region, an intermediate layer including an emissive layer on the pixel electrode, and an opposite electrode on the intermediate layer.

The DBR layer may be formed by alternately stacking a first layer and a second layer that have different refractive indices.

The refractive index of the first layer may be smaller than the refractive index of the second layer.

The first layer may be formed of silicon oxide and the second layer may be formed of silicon nitride.

The high-refractive index layer may have a refractive index greater than the refractive index of the DBR layer.

The high-refractive index layer may be formed of polysilicon.

The organic light-emitting display apparatus may further include an auxiliary layer interposed between the substrate and the DBR layer.

The auxiliary layer may be formed of silicon oxide.

The high-refractive index layer may be disposed on the auxiliary layer.

According to another aspect of the example embodiment, there is provided an organic light-emitting display apparatus including a thin film transistor (TFT) on a substrate, the TFT having an active layer, a gate electrode insulated from the active layer, the gate electrode including a lower gate electrode and an upper gate electrode, an interlayer insulation layer covering the gate electrode, and a source electrode and a drain electrode on the interlayer insulation layer, the source and drain electrodes contacting the active layer, an organic light-emitting device on the substrate, the organic light-emitting device including a stacked structure of a pixel electrode electrically connected to the TFT, an intermediate layer including an emissive layer, and an opposite electrode, a DBR layer between the active layer and the gate electrode of the TFT, and a high-refractive index layer between the substrate and the DBR layer, the high-refractive index layer having a smaller area an area of the pixel electrode.

The high-refractive index layer may be disposed on the substrate so as to face the pixel electrode of a blue sub-pixel for emitting blue light, the pixel electrode included in the organic light-emitting device.

The high-refractive index layer may have a refractive index greater than a refractive index of the DBR layer.

The high-refractive index layer may be formed of polysilicon.

The organic light-emitting display apparatus may further include an auxiliary layer interposed between the substrate and the DBR layer.

The auxiliary layer may be formed of silicon oxide.

The high-refractive index layer may be disposed on the auxiliary layer.

The DBR layer may be formed by alternately stacking a first layer and a second layer that have different refractive indices.

The refractive index of the first layer may be smaller than the refractive index of the second layer.

The first layer may be formed of silicon oxide and the second layer may be formed of silicon nitride.

The high-refractive index layer may be formed of a material same as a material used to form the active layer.

The high-refractive index layer may be disposed on the same layer as the layer on which the active layer is formed.

The organic light-emitting display apparatus may further include a capacitor comprising a lower capacitor electrode formed in the same layer as the layer in which the active layer is formed and an upper capacitor electrode formed on the DBR layer, the capacitor electrically coupled to the TFT.

The high-refractive index layer may be disposed on the same layer as the layer on which the active layer and the lower capacitor electrode are formed.

The high-refractive index layer may be formed of the same material as a material used to form the active layer and the lower capacitor electrode.

According to another aspect of the example embodiment, there is provided a method of manufacturing an organic light-emitting display apparatus including a first mask process of forming an active layer of a TFT and a high-refractive index layer on a substrate, a second mask process of forming a gate electrode of the TFT and a first electrode unit for forming a pixel electrode on the substrate, a third mask process of forming an interlayer insulation layer, the interlayer insulation layer including contact holes exposing edges of the active layer and a hole exposing a part of the first electrode unit, a fourth mask process of forming a source electrode and a drain electrode that contact the active layer via the contact holes and forming the pixel electrode from the first electrode unit, and a fifth mask process of forming a pixel definition layer exposing at least a part of the pixel electrode.

The first mask process may include: forming an amorphous silicon layer on the substrate, forming a polysilicon layer by crystallizing the amorphous silicon layer, and forming the active layer and the high-refractive index layer by patterning the polysilicon layer.

Before the forming of the amorphous silicon layer, the method may further include forming an auxiliary layer on the substrate, wherein the active layer and the high-refractive index layer are disposed on the auxiliary layer.

The second mask process may include: forming a DBR layer on the substrate to cover the active layer and the high-refractive index layer, sequentially forming a first conductive layer and a second conductive layer on the DBR layer, and forming the gate electrode including the first conductive layer as a lower gate electrode and the second conductive layer as an upper gate electrode, by patterning the first conductive layer and the second conductive layer.

The DBR layer may be formed by alternately stacking a first layer and a second layer that have different refractive indices.

The refractive index of the first layer may be smaller than the refractive index of the second layer.

The first layer may be formed of silicon oxide and the second layer may be formed of silicon nitride.

The high-refractive index layer may have a refractive index greater than a refractive index of the DBR layer.

The first mask process may further include: forming a lower capacitor electrode on the substrate in the same layer as the layer in which the active layer and the high-refractive index layer are formed, and forming an upper capacitor electrode over the lower capacitor electrode.

In the second mask process, the DBR layer may be formed on the substrate to cover the lower capacitor electrode.

The fourth mask process may include: forming a third conductive layer on the interlayer insulation layer, forming the source electrode and the drain electrode by patterning the third conductive layer, and forming a pixel electrode comprising the first conductive layer, by removing the second conductive layer constituting the first electrode unit.

The third mask process may include: forming an intermediate layer on the first electrode unit and the gate electrode, and forming a hole via which a part of the first electrode unit is exposed, and the contact holes, by patterning the interlayer insulation layer.

The fifth mask process may include: forming an insulation layer on an entire surface of the substrate to cover the source electrode and the drain electrode, and forming the pixel definition layer by patterning the insulation layer.

After the fifth mask process, the method may further include forming an intermediate layer comprising an emissive layer, and an opposite electrode on an upper surface of the pixel electrode.

The high-refractive index layer may be formed on the substrate so as to correspond to the pixel electrode.

The high-refractive index layer may be formed to be smaller than the pixel electrode.

BRIEF DESCRIPTION OF THE DRAWINGS

The above and other features and advantages of the example embodiments will become more apparent by describing in detail exemplary embodiments thereof with reference to the attached drawings, in which.

DETAILED DESCRIPTION

Example embodiments will now be described more fully with reference to the accompanying drawings, in which aspects of embodiments are shown. As used herein, the term "and/or" includes any and all combinations of one or more of the associated listed items. Expressions such as "at least one of," when preceding a list of elements, modify the entire list of elements and do not modify the individual elements of the list.

Figure 1:
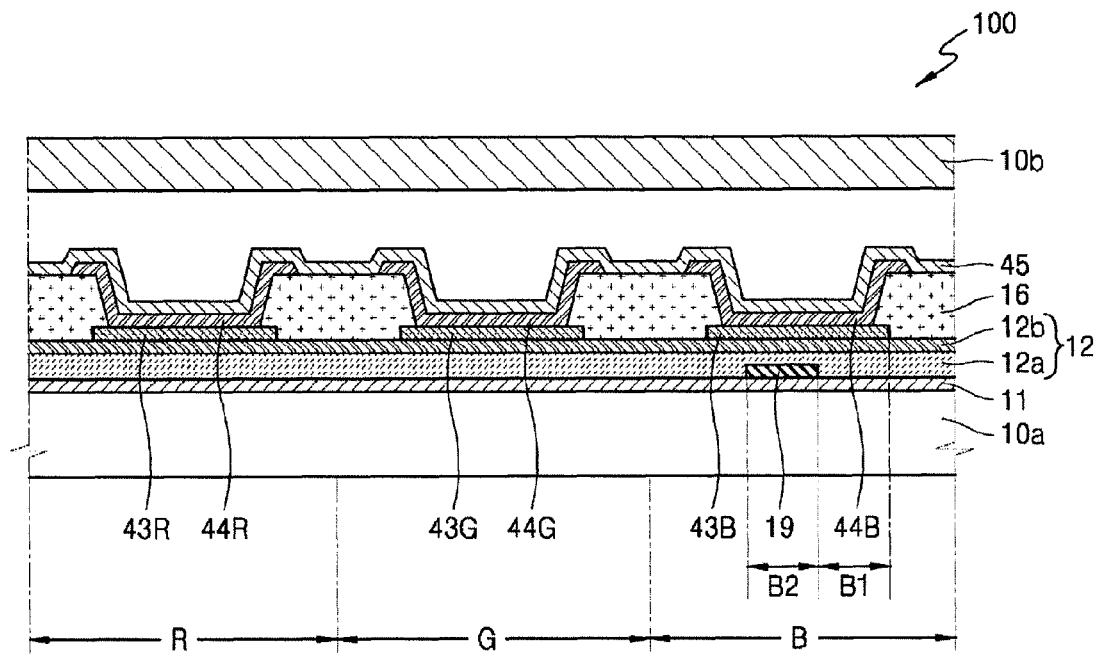
FIG. 1 is a schematic cross-sectional view of an organic light emitting display apparatus according to an embodiment.

FIG. 1 is a cross-sectional view of an organic light emitting display apparatus 100 according to an embodiment. Referring to FIG. 1, the organic light-emitting display apparatus 100 includes a first substrate 10a and red (R), green (G), and blue (B) sub-pixel regions R, G, and B formed on the first substrate 10a.

The first substrate 10a may be, for example, a transparent glass substrate, a plastic substrate, or a metal foil. In another example, a substrate which is used in organic light emitting display apparatuses having a high mechanical strength, high thermal stability, high transparency, high surface smoothness, high handling easiness, and a high waterproof property may be used as the first substrate 10a. As illustrated in FIG. 1, the first substrate 10a may include at least one thin film transistor (TFT) and/or at least one capacitor in each of the R, G, and B sub-pixel regions R, G, and B, and the TFT and the capacitor may constitute a pixel circuit.

A second substrate 10b may be an encapsulation substrate disposed on the first substrate 10a to protect the TFTs, light-emitting pixels, and the like formed on the first substrate 10a from external moisture, air, and the like. The second substrate 10b is positioned to face the first substrate 10a, and the first substrate 10a and the second substrate 10b are joined together by a sealing member (not shown) disposed along the edge of the second substrate 10b. The second substrate 10b may be, e.g., a glass substrate or a plastic substrate.

An auxiliary layer 11, for example, a barrier layer, a blocking layer, and/or a buffer layer, may be formed on an upper surface of the first substrate 10a to prevent diffusion of impurity ions and penetration of moisture or external air and to planarize the upper surface of the first substrate 10a. The auxiliary layer 11 may be formed using, for example, $SiO_2$ and/or $SiN_x$, according to any of various deposition methods, for example, plasma enhanced chemical vapor deposition (PECVD), atmospheric pressure CVD (APCVD), and low pressure CVD (LPCVD). For example, the auxiliary layer 11 formed of $SiO_2$ may have a thickness in the range of about 300 Å to about 400 Å.

A distributed Bragg reflector (DBR) layer 12 may be formed on, e.g., directly on, the auxiliary layer 11. The DBR layer 12 may be formed by stacking a first layer 12a and a second layer 12b on, e.g., directly on, the auxiliary layer 11, e.g., the first layer 12a may be between directly between the auxiliary layer 11 and the second layer 12b. The first layer 12a and the second layer 12b have different refractive indices. For example, the refractive index of the first layer 12a may be smaller than that of the second layer 12b. For example, the first layer 12a may be formed of silicon oxide ($SiO_x$), and the second layer 12b may be formed of silicon nitride ($SiN_x$). Although the first layer 12a and the second layer 12b are stacked in FIG. 1, the example embodiments are not limited thereto, and the first layer 12a and the second layer 12b may be stacked alternately with each other in three or more layers.

Since a layer having a small refractive index (for example, the first layer 12a) and a layer having a large refractive index (for example, the auxiliary layer 11 and the second layer 12b) alternate with each other, the auxiliary layer 11 and the DBR layer 12 generate resonance due to a difference between their refractive indices. Thus, light efficiency and color purity may be improved.

A high-refractive index layer 19 may be formed in the B sub-pixel region B to be interposed between the auxiliary layer 11 and the DBR layer 12, e.g., the high-refractive index layer 19 may be interposed between the auxiliary layer 11 and the first layer 12a. The high-refractive index layer 19 has a refractive index greater than that of the DBR layer 12, e.g., a refractive index greater than either of the first and second layers 12a and 12b. The high-refractive index layer 19 may be formed of, e.g., polysilicon.

The high-refractive index layer 19 may be disposed in the B sub-pixel region B and may be formed to have an area less than that of a blue pixel electrode 43B. For example, the blue pixel electrode 43B may overlap the entire high-refractive index layer 19, and the high-refractive index layer 19 may overlap only a portion of the blue pixel electrode 43B. For example, a part of the blue pixel electrode 43B, i.e., a region B1, includes the DBR layer 12 without the high-refractive index layer 19, and another part of the blue pixel electrode 43B (a region B2 in FIG. 1), e.g., a remaining part of the blue pixel electrode 43B, includes both the DBR layer 12 and the high-refractive index layer 19. Since weak resonance is generated by the DBR layer 12 in the region B1, the luminance of blue light and a Moiré phenomenon may be improved. In the region B2 including the high-refractive index layer 19, since the high-refractive index layer 19 has a refractive index higher than that that of the DBR layer 12, color reproducibility of blue light may be improved.

First electrodes 43R, 43G, and 43B and a second electrode 45 that face each other are formed above the first substrate 10a. The first electrodes 43R, 43G, and 43B may be formed in R, G, and B subpixels, respectively, and may be an anode or a cathode. The second electrode 45 may functions as an anode or a cathode by corresponding to the first electrodes 43R, 43G, and 43B. The second electrode 45 may be formed on intermediate layers 44R, 44G, and 44B by vacuum deposition, sputtering, or the like.

When the organic light-emitting display apparatus 100 is a bottom emission type displaying an image toward the first substrate 10a, the first electrodes 43R, 43G, and 43B may be transparent electrodes and the second electrode 45 is a reflective electrode. The first electrodes 43R, 43G, and 43B may be formed of, for example, ITO, IZO, ZnO, or $In_2O_3$ having a high work function, and the second electrode 45 may be formed of a metal having a low work function such as silver (Ag), magnesium (Mg), aluminum (Al), platinum (Pt), palladium (Pd), gold (Au), nickel (Ni), neodymium (Nd), iridium (Ir), chromium (Cr), lithium (Li), or a compound or alloy of these materials.

When the organic light-emitting display apparatus 100 is a dual emission type, the first electrodes 43R, 43G, and 43B and the second electrode 45 may be all transparent electrodes.

When the first substrate 10a includes TFTs as described above, the first electrodes 43R, 43G, and 43B formed in corresponding sub-pixels may be electrically connected to TFTs of the sub-pixels, respectively. In this case, the second electrode 45 may be formed of a common electrode that extends across all subpixels.

When the first substrate 10a includes no TFTs in each sub-pixel, the first electrodes 43R, 43G, and 43B and the second electrode 45 are formed in strips so that the first electrodes 43R, 43G, and 43B intersect the second electrode 45, and thus may be driven in a Passive Matrix (PM) manner.

The intermediate layers 44R, 44G, and 44B may be interposed between the first electrode 43R and the second electrode 45, between the first electrode 43G and the second electrode 45, and between the first electrode 43B and the second electrode 45, respectively. The intermediate layers 44R, 44G, and 44B may be formed by stacking an organic emissive layer (EML) and at least one functional layer of a hole injection layer (HIL), a hole transport layer (HTL), an electron transport layer (ETL), and an electron injection layer (EIL).

Pixel defining layers 16 may be formed on the first electrodes 43R, 43G, and 43B so as to cover upper ends and lateral surfaces of the first electrodes 43R, 43G, and 43B. The pixel defining layers 16 may have an organic material multi-layered structure, an inorganic material multi-layered structure, or an inorganic/organic material complex multi-layered structure. Silicon oxide ($SiO_2$), silicon nitride ($SiN_x$), silicon oxynitride, or the like may be used as an inorganic material used to form the pixel defining layers 16. An organic insulation material, such as an acryl-based organic compound, polyimide, or polyamide may be used as an organic material used to form the pixel defining layers 16.

Figure 2:
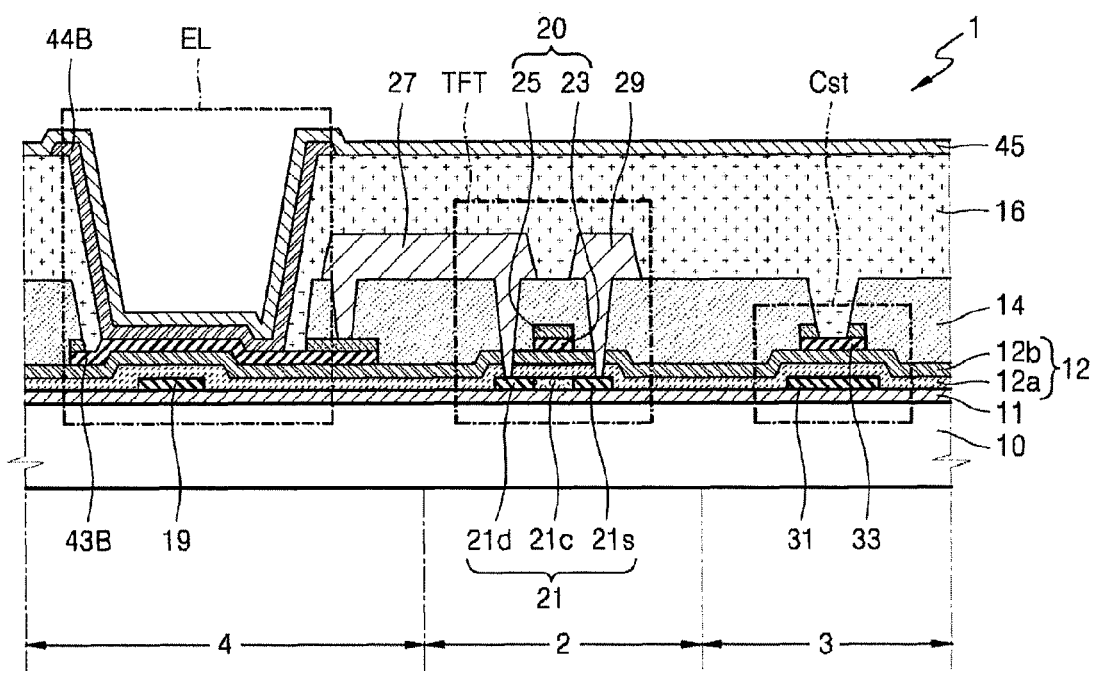
FIG. 2 is a schematic cross-sectional view of an organic light emitting display apparatus according to another embodiment.

FIG. 2 is a schematic cross-sectional view of an organic light emitting display apparatus 1 according to another embodiment. Referring to FIG. 2, the organic light-emitting display apparatus 1 includes a first substrate 10 including a plurality of light-emitting pixels, and a second substrate (not shown) attached to the first substrate 10 by sealing.

A TFT, an organic light-emitting diode (EL), a capacitor Cst, and the like may be formed on the first substrate 10. The first substrate 10 may be, e.g., a low temperature polycrystalline silicon (LTPS) substrate, a glass substrate, a plastic substrate, or the like.

The second substrate may be an encapsulation substrate disposed on the first substrate 10 to protect the TFT, the light-emitting pixels, and the like formed on the first substrate 10 from external moisture, air, and the like. The second substrate is positioned to face the first substrate 10, and the first substrate 10 and the second substrate are joined together by a sealing member (not shown) disposed along the edge of the second substrate. The second substrate may be, e.g., a glass substrate or a plastic substrate.

The organic light-emitting display apparatus 1 is divided into a transistor region 2, a storage region 3, and a light-emitting region 4, on the first substrate 10. The light-emitting region 4 of FIG. 2 represents a B sub-pixel region.

The auxiliary layer 11, for example, a barrier layer, a blocking layer, and/or a buffer layer, may be formed on an upper surface of the first substrate 10 to prevent diffusion of impurity ions and penetration of moisture or external air and to planarize the upper surface of the first substrate 10. The auxiliary layer 11 may be formed of $SiO_2$.

The transistor region 2 includes the TFT serving as a driving device. The TFT includes an active layer 21, a gate electrode 20, a source electrode 29, and a drain electrode 27.

The gate electrode 20 includes a lower gate electrode 23 and an upper gate electrode 25 formed on an upper surface of the lower gate electrode 23. The lower gate electrode 23 may be formed of a transparent conductive material. Examples of the transparent conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO). The upper gate electrode 25 may have a single- or multi-layered structure including a metal or a metal alloy, such as Mo, MoW, or an Al-based alloy.

The DBR layer 12 is interposed between the gate electrode 20 and the active layer 21 to insulate the gate electrode 21 from the active layer 21. The DBR layer 12 may be formed by stacking the first layer 12a and the second layer 12b. The first layer 12a and the second layer 12b have different refractive indices. For example, the refractive index of the first layer 12a may be smaller than that of the second layer 12b. The first layer 12a may be formed of silicon oxide ($SiO_x$), and the second layer 12b may be formed of silicon nitride ($SiN_x$). Although the first layer 12a and the second layer 12b are stacked in FIG. 2, the first layer 12a and the second layer 12b may be stacked alternately with each other in three or more layers.

Since a layer having a small refractive index (for example, the first layer 12a) and a layer having a large refractive index (for example, the auxiliary layer 11 and the second layer 12b) alternate with each other, the auxiliary layer 11 and the DBR layer 12 generate resonance due to a difference between the refractive indices of these layers and thus may improve light efficiency and color purity.

The high-refractive index layer 19 may be formed in the light-emitting region 4 as a B sub-pixel region to be interposed between the auxiliary layer 11 and the DBR layer 12. The high-refractive index layer 19 may be interposed between the auxiliary layer 11 and the first layer 12a. The high-refractive index layer 19 has a refractive index greater than that of the DBR layer 12. The high-refractive index layer 19 may be formed on the same layer as, e.g., at a same distance from an upper surface of the substrate 10 as, the layer on which the active layer 21 of the TFT is formed. The high-refractive index layer 19 may be formed of a same material, e.g., same polysilicon, as the active layer 21.

The high-refractive index layer 19 may be disposed in the B sub-pixel region 4 and may be formed to have an area less than that of a blue pixel electrode 43B. For example, a part of the light-emitting region 4 as the B sub-pixel region includes the DBR layer 12 without the high-refractive index layer 19, and the remaining part of the light-emitting region 4 includes both the DBR layer 12 and the high-refractive index layer 19. Since weak resonance is generated by the DBR layer 12 in the part of the light-emitting region 4 including the DBR layer 12 without the high-refractive index layer 19, the luminance of blue light and a Moiré phenomenon may be improved. In the part of the light-emitting region 4 including the high-refractive index layer 19, since the high-refractive index layer 19 has a refractive index higher than that of the DBR layer 12, the color reproducibility of blue light may be improved.

A source area 21s and a drain area 21d doped with highly-concentrated impurities are formed on both edges, respectively, of the active layer 21, and are connected to the source and drain electrodes 29 and 27, respectively.

The storage region 3 includes the capacitor Cst. The capacitor Cst includes a lower capacitor electrode 31 and an upper capacitor electrode 33, and the DBR layer 12 is interposed between the lower capacitor electrode 31 and the upper capacitor electrode 33. The lower capacitor electrode 31 may be formed on the same layer as the layer on which the active layer 21 of the TFT is formed. The lower capacitor electrode 31 is formed of a semiconductor material, and is doped with impurities to increase electrical conductivity. The upper capacitor electrode 33 may be formed on the same layer as the layer on which the lower gate electrode 23 of the TFT and the blue pixel electrode 43B, which constitutes the EL, are formed. In other words, the upper capacitor electrode 33 may be formed of a transparent conductive material, like the lower gate electrode 23.

The light-emitting region 4 includes the EL. The EL includes the blue pixel electrode 43B connected to the source or drain electrode 29 or 27 of the TFT, an opposite electrode 45 formed to face the blue pixel electrode 43B, and an intermediate layer 44B interposed between the blue pixel electrode 43B and the opposite electrode 45. The blue pixel electrode 43B may be formed of a transparent conductive material, or may be formed of the same material as that used to form the lower gate electrode 23 or the like on the same layer as that on which the lower gate electrode 23 or the like is formed.

FIGS. 3 through 10 are cross-sectional views of stages in a method of manufacturing the organic light emitting display apparatus 1 of FIG. 2. The method of manufacturing the organic light emitting display apparatus 1 of FIG. 2 will now be described schematically.

First, as shown in FIG. 2, the auxiliary layer 11 is formed on the first substrate 10. For example, the first substrate 10 may be formed of a transparent glass material containing $SiO_2$ as a main component. However, the first substrate 10 is not limited thereto. The first substrate 10 may be any substrate formed of various materials, for example, a transparent plastic, a metal, or the like.

The auxiliary layer 11, for example, a barrier layer, a blocking layer, and/or a buffer layer, may be formed on an upper surface of the first substrate 10 to prevent diffusion of impurity ions and penetration of moisture or external air and to planarize the upper surface of the first substrate 10. The auxiliary layer 11 may be formed using, for example, $SiO_2$ and/or $SiN_x$, according to any of various deposition methods, for example, PECVD, APCVD, and LPCVD.

Figure 3:
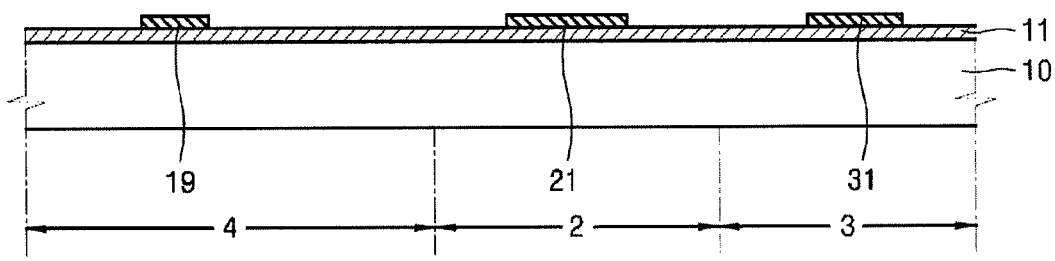
FIGS. 3 through 10 are cross-sectional views of stages in a method of manufacturing the organic light emitting display apparatus shown in FIG. 2.

Next, as shown in FIG. 3, the high-refractive index layer 19, the active layer 21 of the TFT, and the lower capacitor electrode 31 are formed on an upper surface of the auxiliary layer 11. In detail, an amorphous silicon layer (not shown) is first formed on the upper surface of the auxiliary layer 11 and then crystallized to generate a polycrystalline silicon layer (not shown). Amorphous silicon may be crystallized using any of various methods such as rapid thermal annealing (RTA), solid phase crystallization (SPC), excimer laser annealing (ELA), metal induced crystallization (MIC), metal induced lateral crystallization (MILC), and sequential lateral solidification (SLS). The polycrystalline silicon layer is patterned, e.g., simultaneously, to form the high-refractive index layer 19, the active layer 21 of the TFT, and the lower capacitor electrode 31 in respective regions 4, 2, and 3, by using a mask process using a first mask (not shown). It is noted that although the active layer 21 and the lower capacitor electrode 31 are separated from each other in the present embodiment, the active layer 21 and the lower capacitor electrode 31 may be integrally formed.

Figure 4:
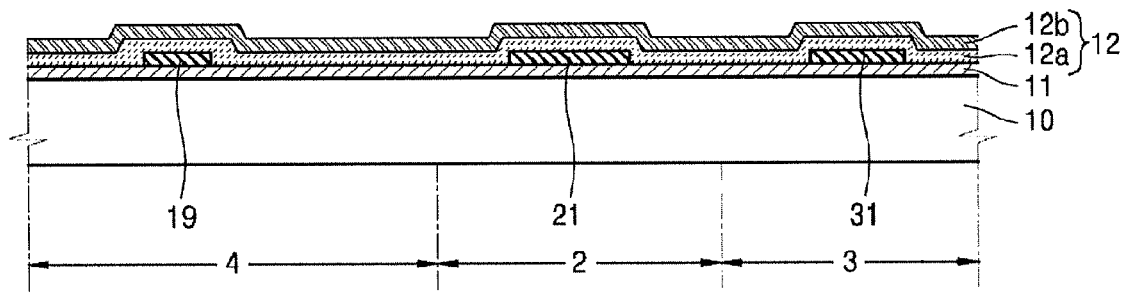

Next, as shown in FIG. 4, the DBR layer 12, a first conductive layer (not shown), and a second conductive layer (not shown) are sequentially formed on the entire surface of the first substrate 10 on which the high-refractive index layer 19, the active layer 21, and the lower capacitor electrode 31 have been formed.

The DBR layer 12 is formed by stacking the first layer 12a and the second layer 12b. The first layer 12a and the second layer 12b have different refractive indices. For example, the refractive index of the first layer 12a may be less than that of the second layer 12b. The first layer 12a may be formed of silicon oxide ($SiO_x$), and the second layer 12b may be formed of silicon nitride ($SiN_x$). Although the first layer 12a and the second layer 12b are stacked in FIG. 4, the first layer 12a and the second layer 12b may be stacked alternately with each other in three or more layers.

Since a layer having a small refractive index (for example, the first layer 12a) and a layer having a large refractive index (for example, the second layer 12b) alternate with each other, the DBR layer 12 generate resonance due to a difference between the refractive indices of these layers and thus may improve light efficiency and color purity.

The DBR layer 12 may be formed according to a method such as PECVD, APCVD, or LPCVD. The DBR layer 12 is disposed between the active layer 21 and the gate electrode 20 of the TFT to serve as a gate insulation layer of the TFT, and also disposed between the upper capacitor electrode 33 and the lower capacitor electrode 31 to serve as a dielectric layer of the capacitor Cst.

The first conductive layer (not shown) may include at least one transparent material, e.g., at least one of ITO, IZO, ZnO, and $In_2O_3$. Thereafter, the first conductive layer may be patterned to form the blue pixel electrode 43B, the lower gate electrode 23, and the upper capacitor electrode 33.

The second conductive layer (not shown) may include at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and copper (Cu). For example, the second conductive layer may have a three-layered structure, e.g., a Mo/Al/Mo structure. It is noted, however, that the first conductive layer may include a high corrosion-resistant material compared to the second conductive layer, so the second conductive layer may include a material that has less resistance than the material of the first conductive layer to smoothly transmit a current.

Figure 5:
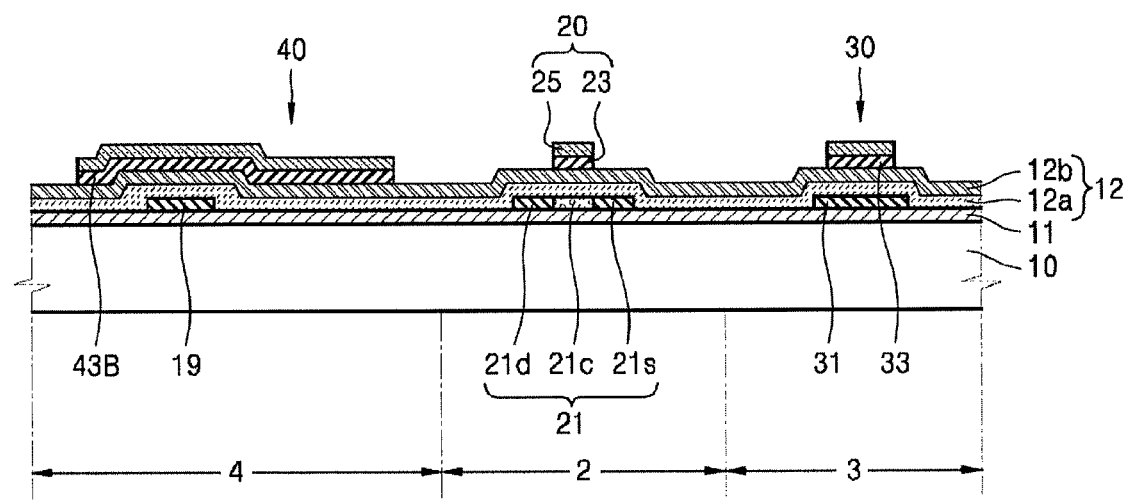

Next, as illustrated in FIG. 5, the first and second conductive layers may be patterned to form the gate electrode 20 in region 2, a first electrode unit 40 in region 4, and a second electrode unit 30 in region 3 of the first substrate 10. In detail, the first conductive layer and the second conductive layer sequentially stacked on the entire surface of the first substrate 10 may be patterned according to a mask process using a second mask (not shown).

The gate electrode 20 is formed over the active layer 21 in the transistor region 2 and includes the lower gate electrode 23 formed of a part of the first conductive layer and the upper gate electrode 25 formed of a part of the second conductive layer. The gate electrode 20 is formed to be aligned with the center of the active layer 21, and the active layer 21 is doped with n-type or p-type impurities by using the gate electrode 20 as a self-aligned mask to form the source and drain areas 21s and 21d on an edge of the active layer 21 corresponding to both sides of the gate electrode 20 and to form a channel area 21c between the source/drain areas 21s and 21d. The impurities may be boron (B) ions or phosphorus (P) ions.

The second electrode unit 30 for forming the upper capacitor electrode 33 is formed over the lower capacitor electrode 31 in the storage region 3, and the first electrode unit 40 for forming the blue pixel electrode 43B is formed in the light-emitting region 4. For example, the second conductive layer is patterned to form simultaneously the second gate electrode 25 with a second patterned conductive layer on each of the upper capacitor electrode 33 and the blue pixel electrode 43B.

Figure 6:
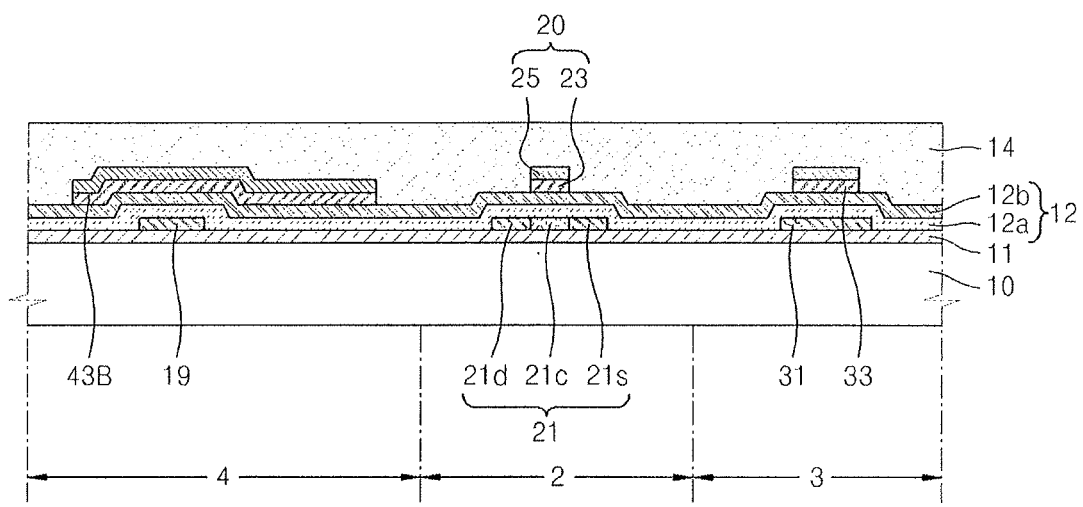

Next, as illustrated in FIG. 6, an interlayer insulation layer 14 is formed on the entire surface of the first substrate 10 on which the gate electrode 20 has been formed. For example, the interlayer insulation layer 14 is formed of at least one organic insulation material, e.g., at least one of polyimide, polyamide, acryl resin, benzocyclobutene (BCB) and a phenolic resin by using a method such as spin coating. The interlayer insulation layer 14 is formed to have a sufficient thickness, for example, to be thicker than the DBR layer 12, and insulates the gate electrode 20 of the TFT from the source and drain electrodes 29 and 27 of the TFT. The interlayer insulation layer 14 may be formed of not only the above-described organic insulation material, but also of an inorganic insulation material such as the above-described inorganic material used to form the DBR layer 12. Alternatively, the interlayer insulation layer 14 may be formed by alternating an organic insulation material with an inorganic insulation material.

Figure 7:
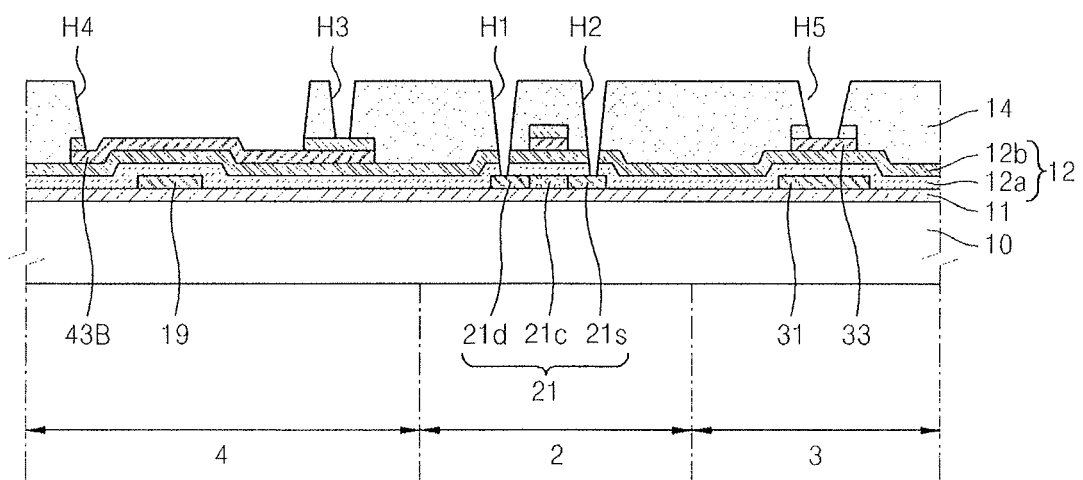

Next, as illustrated in FIG. 7, the interlayer insulation layer 14 is patterned to form holes (a third hole H3, a fourth hole H4, and a fifth hole H5) exposing the second and first electrode unit 30 and 40 and contact holes (a first hole H1 and a second hole H2) exposing parts of the source and drain areas 21s and 21d of the active layer 21.

In detail, the interlayer insulation layer 14 is patterned according to a mask process using a third mask (not shown) to thereby form the contact holes H1 and H2 and the holes H3, H4, and H5. The first hole H1 and the second hole H2 expose parts of the source and drain areas 21s and 21d, respectively, and the third hole H3 and the fourth hole H4 expose at least a part of the first electrode unit 40. The fifth hole H5 exposes at least a part of the second electrode unit 30.

Figure 8:
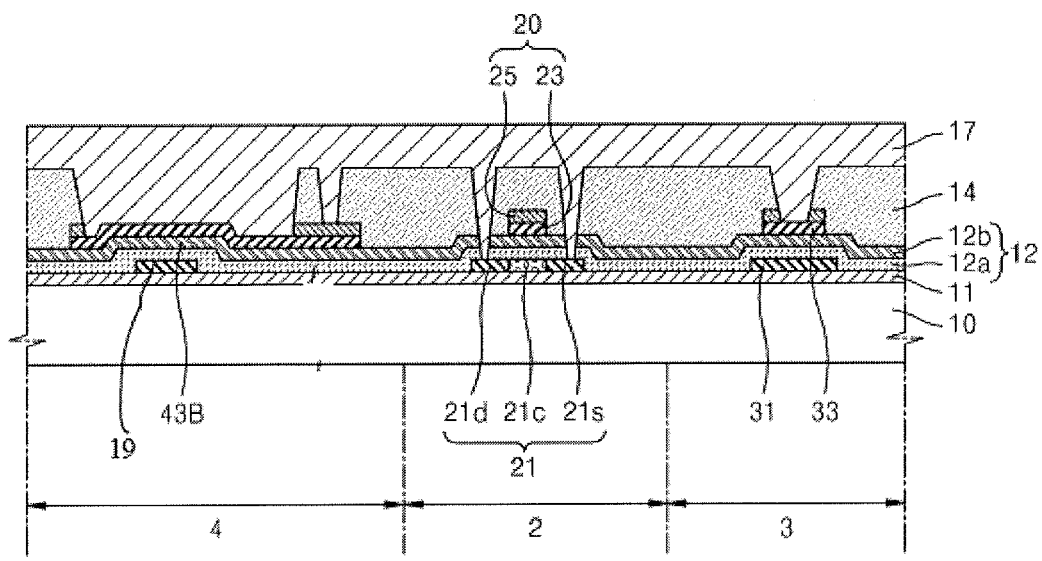

Next, as illustrated in FIG. 8, a third conductive layer 17 is formed on the entire surface of the first substrate 10 so as to cover the interlayer insulation layer 14. The third conductive layer 17 may be formed of one of the conductive materials used to form the first and second conductive layers, but the third conductive layer 17 is not limited thereto and may be formed of any of various other suitable conductive materials. The selected conductive material is deposited to a sufficient thickness enough to fill the contact holes H1 and H2 and the holes H3, H4, and H5.

Figure 9:
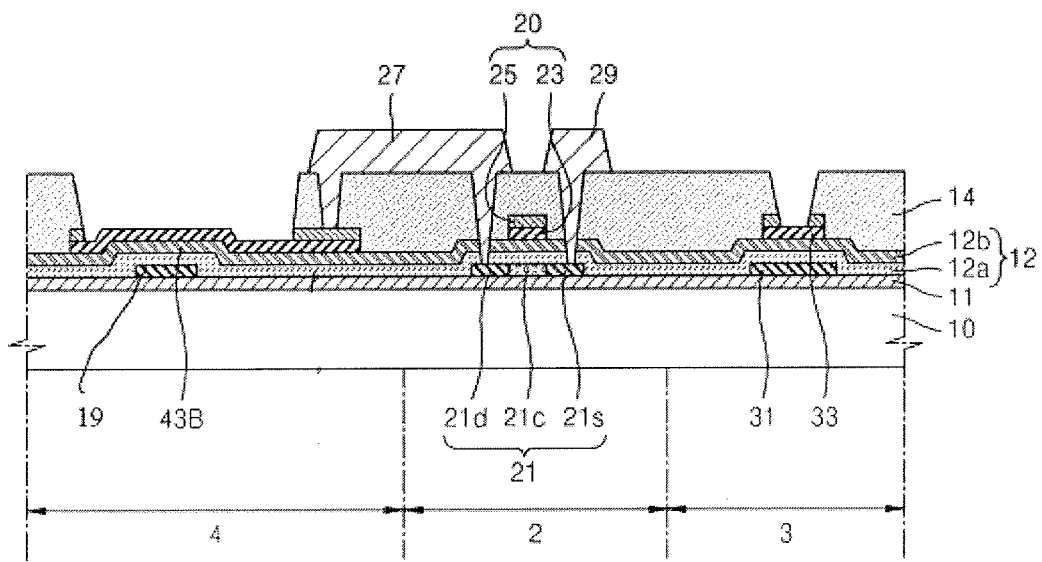

Next, as illustrated in FIG. 9, the third conductive layer 17 of FIG. 8 is patterned to form the source and drain electrodes 29 and 27 and to expose the blue pixel electrode 43B and the upper capacitor electrode 33. In detail, the fourth conductive layer 17 of FIG. 8 is patterned according to a mask process using a fourth mask (not shown) to thereby form the source and drain electrodes 29 and 27.

One electrode selected from the source and drain electrodes 29 and 27 (for example, the drain electrode 27 in FIG. 9) is formed to contact the blue pixel electrode 43B via the third hole H3 in an edge area of the second conductive layer corresponding to an upper portion of the first electrode unit 40 of FIG. 7 in which the blue pixel electrode 43B is to be formed.

As illustrated in FIG. 9, the blue pixel electrode 43B and the upper capacitor electrode 33 are formed, e.g., exposed, at the same time when the third conductive layer 17 is patterned to form the source and drain electrodes 29 and 27. However, the example embodiments are not limited thereto, and the blue pixel electrode 43B and the upper capacitor electrode 33 may be formed via additional etching after the source and drain electrodes 29 and 27 are formed. In detail, the blue pixel electrode 43B may be formed by removing a portion of the second conductive layer thereon exposed via the fourth hole H4. The upper capacitor electrode 33 may be formed by removing a portion of the second conductive layer exposed via the third hole H5.

The lower gate electrode 23, the upper capacitor electrode 33, and the blue pixel electrode 43B are formed of the same material.

The lower capacitor electrode 31 may be doped by injecting n-type or p-type impurities thereinto via the fifth hole H5. The impurities used for the above-described doping may be identical to or different from those used to dope the active layer 21.

Figure 10:
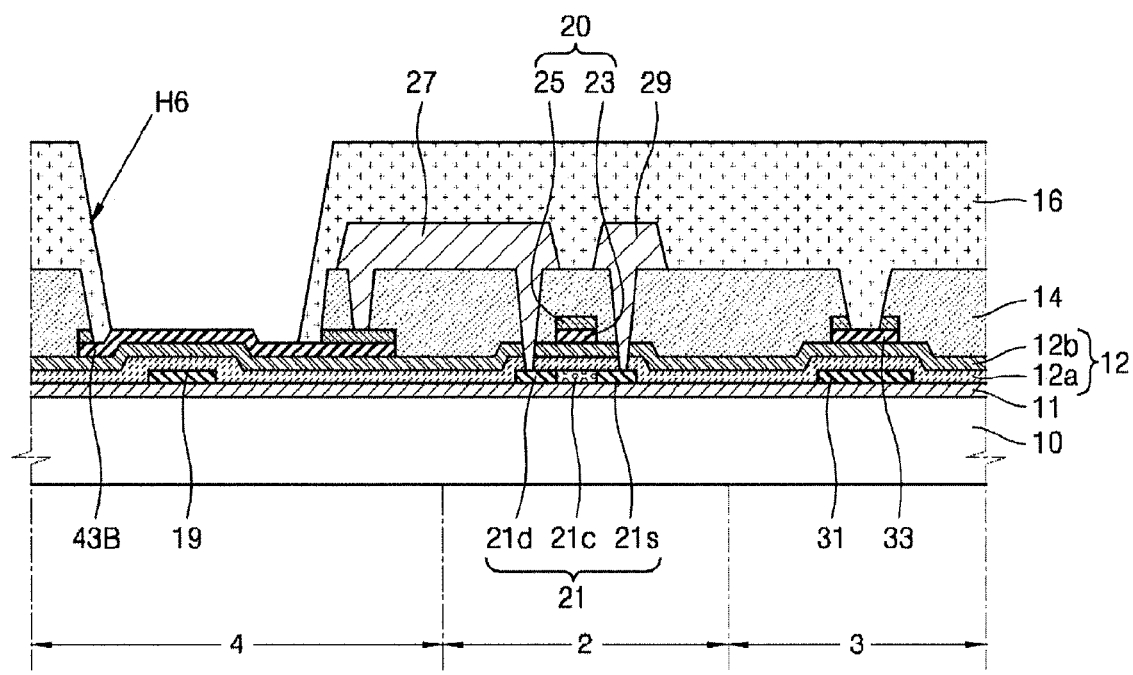

Next, as illustrated in FIG. 10, a pixel definition layer (PDL) 16 is formed on the first substrate 10. In detail, the PDL 16 is formed on the entire surface of the first substrate 10 on which the blue pixel electrode 43B, the source and drain electrodes 29 and 27, and the upper capacitor electrode 33 have been formed. For example, the PDL 16 may be formed of at least one organic insulation material, e.g., at least one of polyimide, polyamide (PA), acryl resin, benzocyclobutene (BCB) and a phenolic resin by using a method such as spin coating. In another example, the PDL 16 may be formed of, e.g., only, an inorganic insulation material, e.g., at least one of $SiO_2$, $SiN_x$, $Al_2O_3$, $CuO_x$, $Tb_4O_7$, $Y_2O_3$, $Nb_2O_5$, $Pr_2O_3$, and TiOx. In yet another example, the PDL 16 may have a multi-layered structure by alternating an organic insulation material with an inorganic insulation material.

The PDL 16 is patterned according to a mask process using a fifth mask (not shown) to thereby form a sixth hole H6 exposing a center portion of the blue pixel electrode 43B. In this way, a pixel is defined.

Thereafter, as illustrated in FIG. 2, the intermediate layer 44B including an emission layer, and the opposite electrode 45 are formed in the sixth hole H6 exposing the blue pixel electrode 43B.

The intermediate layer 44B may be formed by stacking an organic emissive layer (EML) and at least one of a hole injection layer (HIL), a hole transport layer (HTL), an electron transport layer (ETL), and an electron injection layer (EIL). The organic EML may be formed of a low-molecular weight organic material or a high-molecular weight organic polymer.

When the organic EML is formed of the low-molecular weight organic material, the intermediate layer 44B is obtained by stacking the HTL, the HIL, and the like on a surface of the organic EML facing the blue pixel electrode 43B, and the ETL, the EIL, and the like on a surface of the organic EML facing the opposite electrode 45. Various other suitable layers may be stacked if necessary. Examples of organic materials that may be used to form the organic EML include any of various suitable materials, e.g., copper phthalocyanine (CuPc), N, N'-Di(naphthalene-1-yl)-N,N'-diphenyl-benzidine (NPB), and tris-8-hydroxyquinoline aluminum (Alq3).

On the other hand, when the organic emissive layer is formed of a high-molecular weight organic polymer, the intermediate layer 44B may be formed by stacking only a HTL on the surface of the organic EML facing the blue pixel electrode 43B. The HTL may be formed of poly-(3,4)-ethylene-dihydroxy thiophene (PEDOT), polyaniline (PANI), or the like on the upper surface of the blue pixel electrode 43B by inkjet printing or spin coating. High-molecular weight organic polymers, e.g., polyphenylenevinylenes (PPVs) and polyfluorenes, may be used as the organic polymers forming the organic EML. A color pattern may be formed by using a typical method such as inkjet printing, spin coating, or a thermal transfer method using a laser.

The opposite electrode 45 may be formed on the entire surface of the first substrate 10 so as to serve as a common electrode. In the organic light-emitting display apparatus 1 according to the present embodiment, the blue pixel electrode 43B is used as an anode electrode, and the opposite electrode 45 is used as a cathode electrode. Alternatively, the blue pixel electrode 43B may be used as a cathode electrode, and the opposite electrode 45 may be used as an anode electrode.

When the organic light-emitting display apparatus 1 is a bottom emission type displaying an image toward the first substrate 10, the blue pixel electrode 43B is a transparent electrode and the opposite electrode 45 is a reflective electrode. The reflective electrode may be formed by thinly depositing a metal having a low work function, such as Ag, Mg, Al, Pt, Pd, Au, Ni, Nd, Ir, Cr, Li, Ca, LiF/Ca, LiF/Al, or a combination thereof.

A removal of a stacked layer during each mask process performed to form an organic light emitting display apparatus may be achieved by dry etching or wet etching.

In a bottom-emission type display apparatus and a manufacturing method thereof according to an embodiment, a resonance structure may be realized by the DBR layer 12, and in particular, light characteristics of blue light, such as luminance and color reproducibility, may be improved by the high-refractive index layer 19 formed to be smaller than a B sub-pixel region. Since the bottom-emission type display apparatus having this structure is manufactured using only five (5) masks, the manufacturing of an organic light-emitting display apparatus may be simplified and the manufacturing costs thereof may be reduced.

Although an organic light-emitting display apparatus is illustrated in the above-described embodiment, the example embodiments are not limited thereto, and various suitable display devices including a liquid crystal display (LCD) may be used.

Although a single TFT and a single capacitor are illustrated in the above-described embodiment, this illustration is only for convenience of explanation, and the example embodiments are not limited thereto. As long as the number of mask processes used is not increased, a plurality of TFTs and a plurality of capacitors may be included. As such, the number of masks to be used is reduced, as compared to conventional methods, and emission properties of blue light may be improved.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:

1. A method of manufacturing an organic light-emitting display apparatus, the method comprising:
   simultaneously forming an active layer of a TFT and a refractive layer on a substrate;

forming a DBR layer covering the active layer and the refractive layer, such that each of the active layer and the refractive layer is between the substrate and the DBR layer;

simultaneously forming a gate electrode of the TFT and a first electrode unit on the DBR layer, such that the first electrode unit overlaps the refractive layer, and the DBR layer is between the active layer and the gate electrode of the TFT;

forming an interlayer insulation layer covering the gate electrode and the first electrode unit;

simultaneously forming contact holes in the interlayer insulation layer and the DBR layer exposing portions of the active layer and an opening exposing a first part of the first electrode unit;

forming a third conductive layer on the interlayer insulation layer, such that the third conductive layer fills the contact holes and the opening;

simultaneously forming a source electrode and a drain electrode on the interlayer insulation layer that contact the active layer via the contact holes and exposing at least a portion of the first part of the first electrode unit by patterning the third conductive layer; and forming a pixel definition layer, such that at least a part of the first electrode unit is exposed.

2. The method of claim 1, wherein the active layer of the TFT and the refractive layer are formed of polysilicon directly on a same element, such that a distance from a bottom surface of the active layer of the TFT to a top of the substrate equals a distance from a bottom surface of the refractive layer to the top of the substrate.

3. The method of claim 2, further comprising forming an auxiliary layer on the substrate, the active layer and the refractive layer being disposed directly on the auxiliary layer.

4. The method of claim 1, wherein
each of the gate electrode and the first electrode unit includes a first conductive layer and a second conductive layer sequentially stacked on each other, such that the gate electrode includes the first conductive layer as a lower gate electrode and the second conductive layer as an upper gate electrode, and a distance from a bottom surface of the gate electrode to a top of the substrate equals a distance from a bottom surface of the first electrode unit to the top of the substrate.

5. The method of claim 1, wherein the DBR layer is formed by alternately stacking a first layer and a second layer that have different refractive indices.

6. The method of claim 5, wherein the refractive index of the first layer is smaller than the refractive index of the second layer.

7. The method of claim 5, wherein the first layer is formed of silicon oxide and the second layer is formed of silicon nitride.

8. The method of claim 5, wherein the refractive layer has a refractive index greater than a refractive index of either of the first and second layers of the DBR layer.

9. The method of claim 1, further comprising forming a lower capacitor electrode on the substrate in the same layer as the layer in which the active layer and the refractive layer are formed.

10. The method of claim 9, wherein, in the forming of the DBR layer, the DBR layer is formed on the substrate to cover the lower capacitor electrode.

11. The method of claim 1, further comprising, after forming the pixel definition layer, forming an emissive layer and an opposite electrode on an upper surface of the exposed first electrode unit.

12. The method of claim 1, wherein the refractive layer is formed to be smaller than the pixel electrode.

13. The method of claim 12, wherein the refractive layer overlaps only a portion of the first electrode unit.

14. The method of claim 1, wherein the substrate includes a plurality of red, green, and blue sub-pixel regions, and the refractive layer is formed only in a blue sub-pixel region among the red, green, and blue sub-pixel regions.

15. The method of claim 14, wherein the refractive index layer overlaps only a portion of the electrode unit, such that a first portion of blue light emitted from an emissive layer in the blue subpixel region passes through the pixel electrode in the blue sub-pixel, the DBR layer in the blue sub-pixel, and the substrate in the blue sub-pixel, and another portion of the blue light passes through the pixel electrode in the blue sub-pixel, the DBR layer in the blue sub-pixel, the refractive index layer, and the substrate in the blue sub-pixel.

16. The method of claim 14, wherein the refractive layer is electrically independent of the pixel electrode in the blue sub-pixel region.

* * * * *